United States Patent
Wang

(10) Patent No.: US 9,318,690 B2
(45) Date of Patent: *Apr. 19, 2016

(54) PIEZOELECTRIC ELEMENT, LIQUID EJECTING HEAD, AND LIQUID EJECTING APPARATUS

(71) Applicant: SEIKO EPSON CORPORATION, Tokyo (JP)

(72) Inventor: Xiaoxing Wang, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/669,680

(22) Filed: Mar. 26, 2015

(65) Prior Publication Data

US 2015/0200352 A1     Jul. 16, 2015

Related U.S. Application Data

(63) Continuation of application No. 13/046,517, filed on Mar. 11, 2011.

(30) Foreign Application Priority Data

Mar. 12, 2010   (JP) .................................. 2010-056807
May 18, 2010   (JP) .................................. 2010-114761

(51) Int. Cl.
  *B41J 2/045*    (2006.01)
  *H01L 41/187*  (2006.01)
  (Continued)

(52) U.S. Cl.
  CPC ......... *H01L 41/1873* (2013.01); *B41J 2/14201* (2013.01); *B41J 2/14233* (2013.01); *C04B 35/495* (2013.01); *B41J 2002/14491* (2013.01); *B41J 2202/03* (2013.01); *C04B 2235/3201* (2013.01); *C04B 2235/3203* (2013.01); *C04B 2235/3208* (2013.01); *C04B 2235/3248* (2013.01); *C04B 2235/3251* (2013.01); *C04B 2235/3268* (2013.01); *C04B 2235/3294* (2013.01); *C04B 2235/3298* (2013.01); *C04B 2235/77* (2013.01); *C04B 2235/80* (2013.01); *H01L 41/0973* (2013.01); *H01L 41/1878* (2013.01)

(58) Field of Classification Search
  None
  See application file for complete search history.

(56) References Cited

U.S. PATENT DOCUMENTS

| 6,093,339 A | 7/2000 | Kimura et al. |
| 7,323,764 B2 | 1/2008 | Wallis |

(Continued)

FOREIGN PATENT DOCUMENTS

| CN | 1911663 | 2/2007 |
| CN | 101389580 | 3/2009 |

(Continued)

OTHER PUBLICATIONS

Extended European Search Report dated Dec. 3, 2012 for European Patent Application No. 11157440.6.

*Primary Examiner* — Erica Lin
(74) *Attorney, Agent, or Firm* — Workman Nydegger

(57) ABSTRACT

A piezoelectric element is provided. The piezoelectric element includes a piezoelectric layer made of a perovskite compound containing sodium, potassium, lithium, niobium and tantalum and bismuth manganate. The piezoelectric element may also include electrodes for applying a voltage to the piezoelectric layer. The piezoelectric layer may contain 0.25 to 1 mol % of bismuth manganate relative to the perovskite ceramics.

8 Claims, 8 Drawing Sheets

(51) Int. Cl.
*B41J 2/14* (2006.01)
*C04B 35/495* (2006.01)
*H01L 41/09* (2006.01)

(56) References Cited

U.S. PATENT DOCUMENTS

| | | |
|---|---|---|
| 7,530,673 B2 | 5/2009 | Sumi |
| 7,845,767 B2 | 12/2010 | Sakashita et al. |
| 7,911,117 B2 | 3/2011 | Yamaguchi et al. |
| 8,092,706 B2 | 1/2012 | Uraki et al. |
| 8,119,023 B2 | 2/2012 | Tanaka et al. |
| 2004/0127344 A1* | 7/2004 | Sato et al. ..................... 501/134 |
| 2010/0187466 A1 | 7/2010 | Wang et al. |
| 2011/0037810 A1* | 2/2011 | Wang ............................ 347/68 |

FOREIGN PATENT DOCUMENTS

| | | |
|---|---|---|
| DE | 19964243 | 2/2002 |
| EP | 2104155 | 9/2009 |
| EP | 2104155 A2 * | 9/2009 |
| JP | 11-228225 | 8/1999 |
| JP | 11-228227 | 8/1999 |
| JP | 2001-223404 | 8/2001 |
| JP | 2007-116091 | 5/2007 |
| JP | 2008-050206 | 3/2008 |
| JP | 2009-132598 | 6/2009 |
| JP | 2009-256182 | 11/2009 |
| WO | 2008143160 | 11/2008 |

\* cited by examiner

PIEZOELECTRIC ELEMENT, LIQUID EJECTING HEAD, AND LIQUID EJECTING APPARATUS

CROSS-REFERENCE TO RELATED APPLICATIONS

The present application is a Continuation of U.S. patent application Ser. No. 13/046,517 filed on Mar. 11, 2011, which claims priority to Japanese Patent Application No. 2010-056807 filed Mar. 12, 2010, and Japanese Patent Application No. 2010-114761 filed May 18, 2010 the contents of which are hereby incorporated by reference in their entirety.

BACKGROUND

1. Technical Field

The present invention relates to a liquid ejecting head and a liquid ejecting apparatus, and to a piezoelectric element.

2. Related Art

Ink jet recording heads are a typical type of liquid ejecting head. An ink jet recording head includes a vibration plate defining a part of a pressure generating chamber communicating with a nozzle aperture through which ink droplets are ejected. In the ink jet recording head, a piezoelectric element vibrates to deform the vibration plate so as to apply a pressure to the ink in the pressure generating chamber, thereby ejecting ink droplets through the nozzle aperture. Some of the piezoelectric elements used in ink jet recording heads comprises a piezoelectric layer and two electrodes. The piezoelectric layer is made of a piezoelectric material with electromechanical conversion. Two electrodes are on two sides of the piezoelectric layer. This type of piezoelectric element is used as a deflection vibration mode actuator device of a liquid ejecting head.

JP-A-2001-223404 discloses a liquid ejecting head using lead zirconate titanate (PZT) having a high displacement property as the piezoelectric ceramic. However, liquid ejecting heads using piezoelectric ceramics in which the content of lead, which is a toxic substance, is reduced are desired from the viewpoint of environmental protection. It is known that $(K,Na)NbO_3$ materials, called as KNN are important lead-free piezoelectric ceramics having a $ABO_3$ perovskite structure and containing potassium, sodium and niobium, as its main composition (for example, JPA-2008-50206).

However, KNN materials exhibit a relatively high dielectric loss (tan δ) and insufficient durability. This problem exists not only in liquid ejecting heads represented by an ink jet recording head, but also in piezoelectric elements used in other apparatuses.

SUMMARY

The object of the present invention is to provide a liquid ejecting head using a lead free (or less) piezoelectric element with high durability, a liquid ejecting apparatus using the liquid ejecting head, and piezoelectric element.

According to an embodiment of the invention, a liquid ejecting head is provided which includes a pressure generating chamber communicating with a nozzle aperture through which liquid droplets are ejected, and a piezoelectric element including a piezoelectric layer and electrodes that apply a voltage to the piezoelectric layer. The piezoelectric layer is made of a solid solution containing a perovskite ceramics containing sodium, potassium, lithium, niobium and tantalum and bismuth manganate.

In this embodiment, the liquid ejecting head contains a piezoelectric element with a low dielectric loss (tan δ), high durability and low environmental load. In addition, the piezoelectric element has a superior water resistance.

Preferably, the piezoelectric composition contains 0.25 to 1 mol % of bismuth manganate relative to the perovskite ceramics. If suitable a liquid ejecting head comprising a piezoelectric element with higher durability.

Preferably, the piezoelectric layer further contains calcium zirconate. The piezoelectric element comprising a piezoelectric layer with such a composition can be superior in durability and have a high dielectric constant and high thermal stability.

Preferably, the piezoelectric layer contains 1 to 4 mol % of calcium zirconate relative to the perovskite ceramics. The piezoelectric element comprising a piezoelectric layer containing such a composition shows a superior durability and has a high dielectric constant and high thermal stability.

In another embodiment, a liquid ejecting apparatus comprising the above liquid ejecting head is provided. The liquid ejecting apparatus can be superior in durability and has low environmental load. In addition, the liquid ejecting apparatus has a piezoelectric element superior in water resistance.

According to a preferred embodiment of the invention, a piezoelectric element is provided which comprises a piezoelectric layer made of a perovskite ceramics containing sodium, potassium, lithium, niobium and tantalum and bismuth manganate, and electrodes that apply a voltage to the piezoelectric layer. The piezoelectric element is superior in durability and have low environmental load. In addition, the piezoelectric element has an excellent water resistance.

Preferably, the piezoelectric layer further contains calcium zirconate. The piezoelectric element shows a superior durability and has a high dielectric constant and high thermal stability.

BRIEF DESCRIPTION OF THE DRAWINGS

The figures enclosed in the invention will be described as follows.

DESCRIPTION OF EXEMPLARY EMBODIMENTS

First Embodiment

Figure 1:
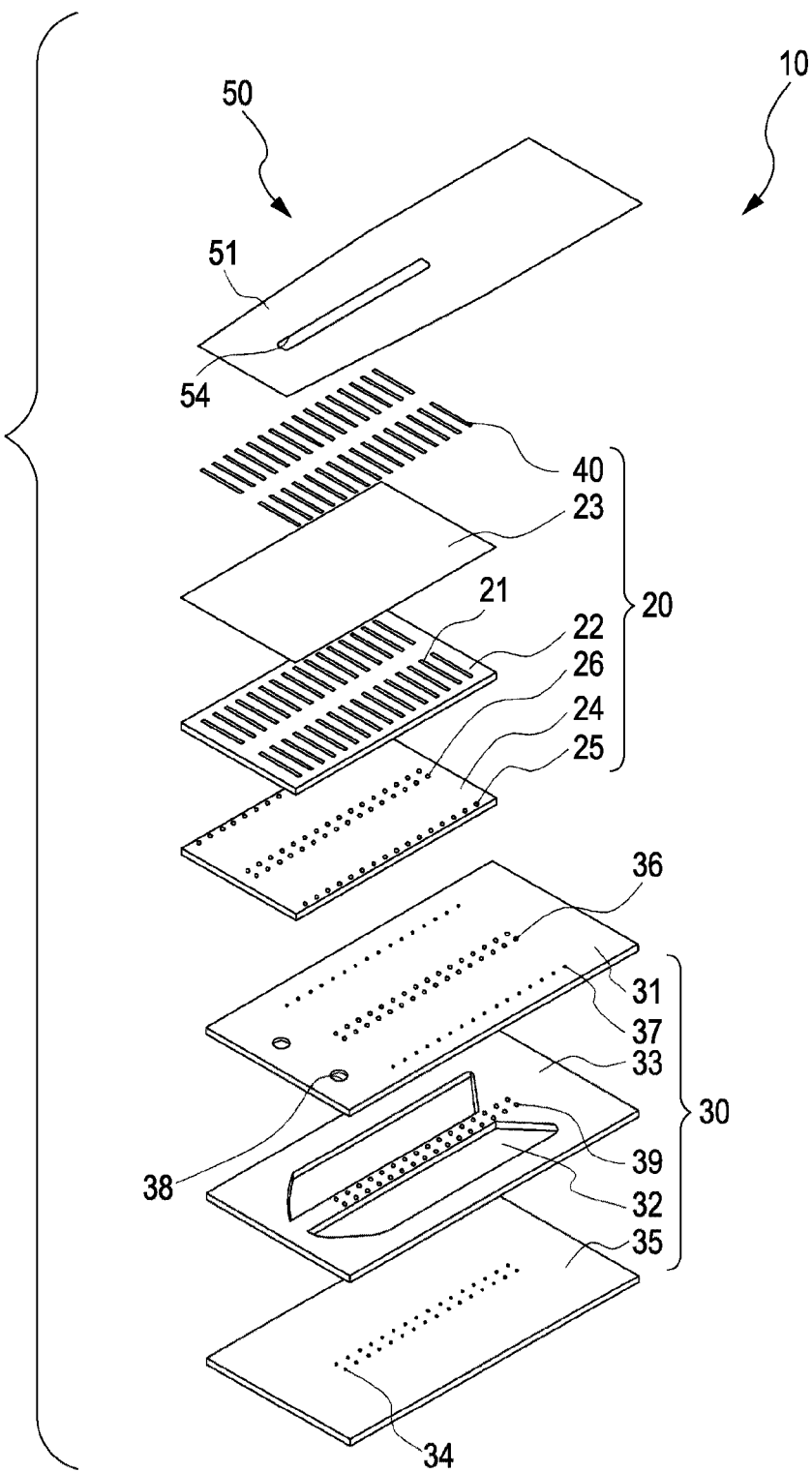
FIG. 1 shows an exploded perspective view of a recording head according to a first embodiment.
Figure 2:
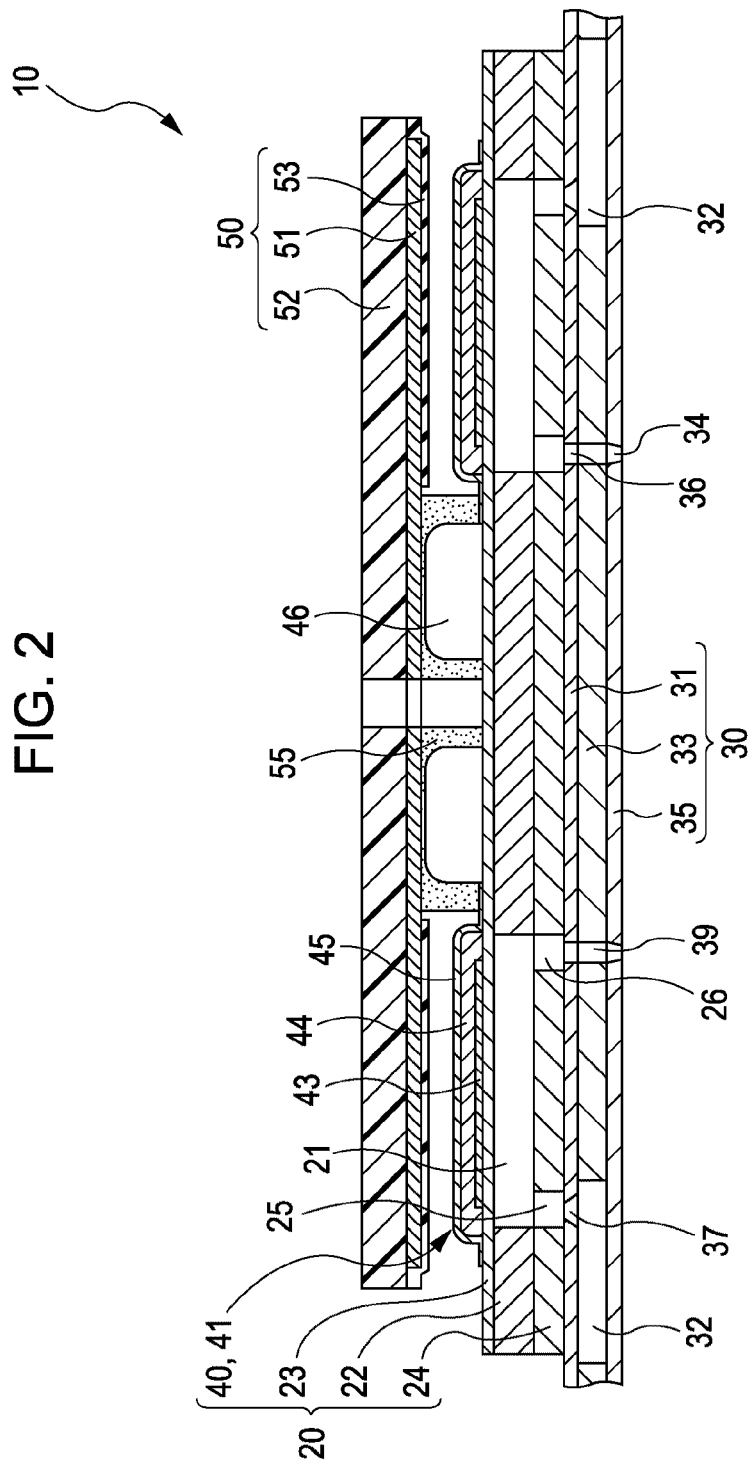
FIG. 2 shows a sectional view of the recording head according to the first embodiment.

FIG. 1 shown an exploded perspective view of an ink jet recording head, which is an example of liquid ejecting head relating to a first embodiment. FIG. 2 is a sectional view of the ink jet recording head.

As shown in these figures, the ink jet recording head 10 comprising an actuator unit 20, a flow channel unit 30 to which the actuator unit 20 is secured, and a wiring substrate 50 connected to the actuator unit 20.

The actuator unit 20 is an actuator device comprising a piezoelectric element 40. The actuator unit 20 includes a flow channel substrate 22 on which pressure generating chambers 21 are formed, a vibration plate 23 disposed on one surface of the flow channel substrate 22, and a pressure generating chamber bottom plate 24 disposed on the other surface of the flow channel substrate 22.

The flow channel substrate 22 is made of, for example, a ceramic plate in a thickness about 150 μm, such as an alumina ($Al_2O_3$) plate or a zirconia ($ZrO_2$) plate. In the present embodiment, a plurality of pressure generating chambers 21 are formed in the flow channel substrate 22 so as to be arranged in parallel in two rows in the width direction thereof. The vibration plate 23 is made of, for example, a 10 μm thick zirconia thin plate, and is secured to a surface of the flow channel substrate 22 so as to seal one side of each of the pressure generating chambers 21.

The pressure generating chamber bottom plate 24 is secured to the other side of the flow channel substrate 22 to seal the other side of each of the pressure generating chambers 21, and has supply communication holes 25 and nozzle communication holes 26. The supply communication holes 25 are each formed near one end in the longitudinal direction of a corresponding pressure generating chamber 21 to connect the pressure generating chamber 21 and reservoir (described later). The nozzle communication holes 26 are formed near the other ends of the pressure generating chambers 21 to communicate with nozzle apertures 34 (described later).

Piezoelectric elements 40 are disposed in regions on the vibration plate 23 that oppose the respective pressure generating chambers 21. In the present embodiment, since the pressure generating chambers 21 are arranged in two rows, the piezoelectric elements 40 are also arranged in two rows.

Each piezoelectric element 40 includes a first electrode (electrode layer) 43 formed on the vibration plate 23, a piezoelectric layer (piezoelectric ceramic layer) 44 formed separately for each pressure generating chamber 21, and a second electrode (electrode layer) 45 formed for each piezoelectric layer 44. In the present embodiment, the piezoelectric layer 44 is formed of a piezoelectric material to a relatively large thickness (for example, 10 to 1000 μm). For example, the piezoelectric layer 44 may be a bulk layer formed by a solid process, for example, by compacting a physically mixed or pulverized metal oxide or metal carbonate powder and firing the compact. The first electrode 43 is formed over the piezoelectric layers 44 to act as a common electrode of the piezoelectric elements 40, and functions as a part of the vibration plate. Alternatively, a plurality of first electrodes 43 may be provided for the respective piezoelectric layers 44.

The flow channel substrate 22, the vibration plate 23 and the pressure generating chamber bottom plate 24, which constitute the actuator unit 20, are formed of green sheets of ceramic clay having predetermined thicknesses. The green sheets of the individual layers of the actuator unit 20 are stacked after the pressure generating chambers 21 have been formed therein, and the stack of the green sheets is then fired to be integrated without using an adhesive. Subsequently, the piezoelectric elements 40 are formed on the vibration plate 23.

In the present embodiment, the piezoelectric layer 44 disposed on the first electrode 43 is made of a perovskite compound containing sodium (Na), potassium (K), lithium (Li), niobium (Nb) and tantalum (Ta) and bismuth manganate, such as $BiMnO_3$. Perovskite compound refers to a compound having a $ABO_3$ perovskite structure. The A site in the perovskite structure, has 12 oxygen ligands, and the B site has 6 oxygen ligands to form an octahedron. Na, K and Li, and optionally Ca, exist in the A site, and Nb and Ta, and optionally Zr, exist in the B site. The piezoelectric layer 44 contains a small amount of bismuth manganate. The Bi of the bismuth manganate is considered to exist in the A site, and the Mn of the bismuth manganate may be present in the B site of the perovskite ceramics. That is to say, Na, K, Li and Bi and Ca occupies A site, Nb, Ta and Mn, and Zr occupies B site of the perovskite structure.

By using such a KNN piezoelectric ceramic with perovskite structure containing Na, K, Li, Nb and Ta and bismuth manganate for the piezoelectric layer 44, the dielectric loss (tan δ) is low (for example, 2.0% or less), as will be described later, and the resulting piezoelectric element 40 including the piezoelectric layer 44 exhibits high durability. The piezoelectric element 40 can also be superior in water resistance. Furthermore, since the lead and antimony contents are not used and the piezoelectric layer can be substantially lead-free and antimony-free, thus environmental pollution can be reduced effectively.

Preferably, the piezoelectric layer 44 further contains calcium zirconate, such as $CaZrO_3$. The dielectric constant and the thermal stability of piezoelectric layer 44 can be enhanced with further addition of calcium zirconate is enhanced.

The mole fractions of the elements in the perovskite compound containing Na, K, Li, Nb and Ta are not particularly limited. For example, the mole fractions of K and Na can be 42 to 48 mol % and 47.5 to 52 mol %, respectively, relative to the sum of the moles of Na, K and Li, and the mole fraction of Nb can be 80 to 85 mol % relative to the sum of the moles of Nb and Ta.

Also, additional amount of bismuth manganate and calcium zirconate are not particularly limited. Bismuth manganate and calcium zirconate can be added in a small amount to the perovskite compound containing Na, K, Li, Nb and Ta. For example, 0.25 to 1 mol % of bismuth manganate are preferable to the perovskite compound. Also, 1 to 4 mol % of calcium zirconate can be added to the perovskite ceramics. The piezoelectric material with such a composition can be expressed by formula (1). If $CaZrO_3$ is not added, n in the following formula (1) is zero.

$$(K_x,Na_y,Li_{1-x-y})(Nb_z,Ta_{1-z})O_3\text{-}m[BiMnO_3]\text{-}n[CaZrO_3] \quad (1)$$

(0.420≤x≤0.480, 0.475≤y≤0.520, 0.80≤z≤0.85, 0.0025≤m≤0.01, 0.01≤n≤0.04)

Figure 3:
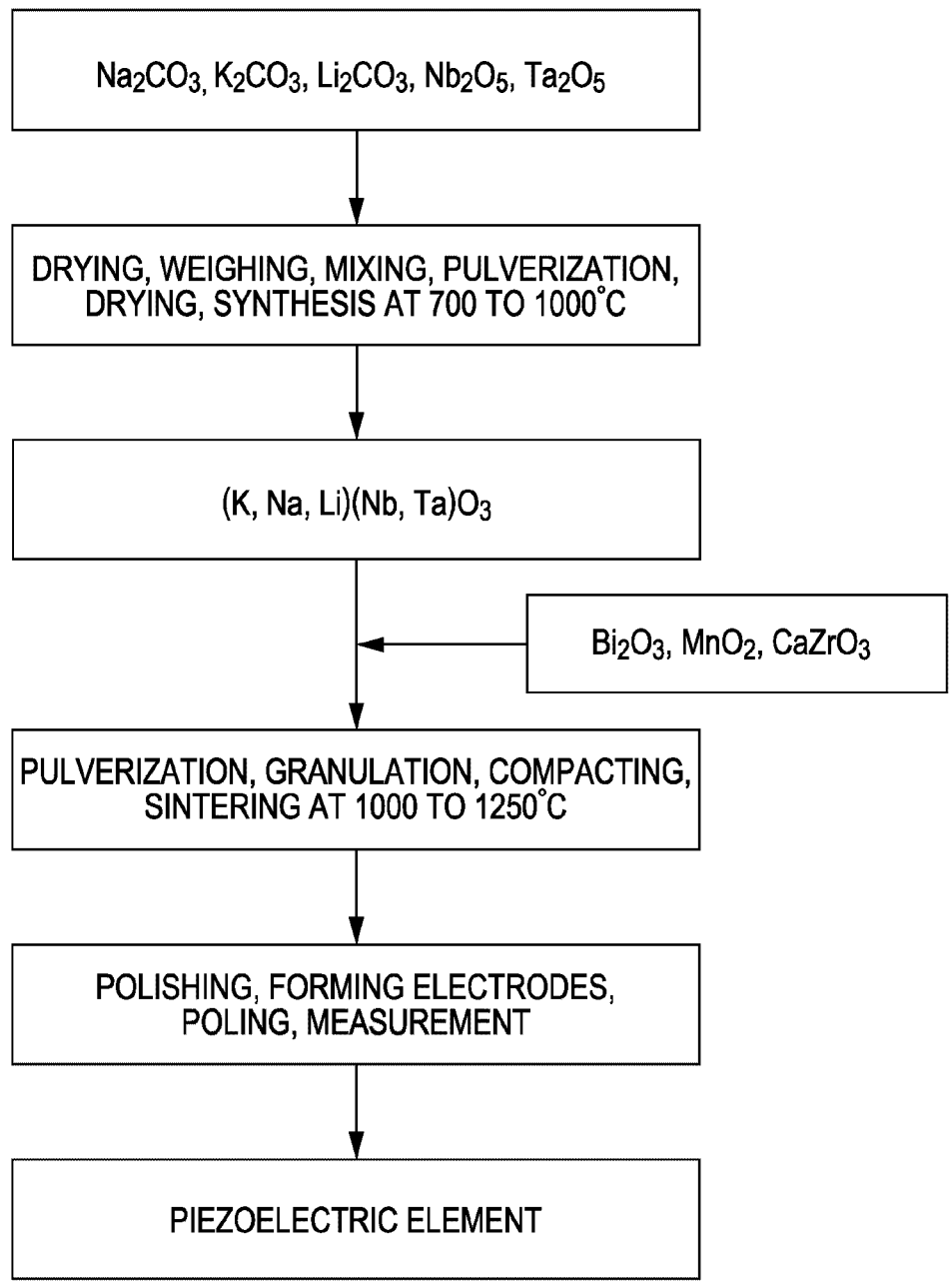
FIG. 3 shows a flow diagram of a method for manufacturing a piezoelectric element according to the first embodiment.

The manufacturing method of the piezoelectric element 40 is not particularly limited. For example, to form the piezoelectric layer 44 of the piezoelectric element 40, oxides or carbonates of sodium, potassium, lithium, niobium and tantalum are mixed together and calcined to prepare a complex oxide containing sodium, potassium, lithium, niobium and tantalum. Oxides or carbonate of manganese and bismuth are added into the compound and sintered into KNN ceramics. An exemplary manufacturing method of the piezoelectric element 40 will now be described with reference to FIG. 3. FIG. 3 is a flow chart of a manufacturing method of the piezoelectric element.

As shown in FIG. 3, for example, $Na_2CO_3$, $K_2CO_3$, $Li_2CO_3$, $Nb_2O_5$ and $Ta_2O_5$ powders are used as the starting materials of the piezoelectric layer 44. After being dried, the powder are weighed according to the stoichiometoric ratio so that the metal elements can have predetermined proportions, and are mixed and pulverized with, for example, pure water or ethanol in a ball mill to get a mixture. The mixture is synthesized (calcined) at a temperature from 700 to 1000° C. to yield a KNN perovskite compound containing K, Na, Li, Nb and Ta.

Subsequently, $Bi_2O_3$ powder and $MnO_2$ powder, and optionally $CaZrO_3$ powder, are added to the compound powder. Then they are mixed in a ball mill dried. After a predetermined amount of binder is added, the mixture is granulated and pressed into a compact in a die under a predetermined pressure (for example, 1000 to 2000 kg/cm$^2$). After being degreased at temperature from 600 to 700° C., the compact is sintered at about 1000 to 1250° C. to become a piezoelectric plate having a composition expressed in formula (1).

Then, the piezoelectric plate is polished, and the first electrode 43 and the second electrode 45 are formed on the two surfaces of the piezoelectric plate. After being subjected to poling and various measurements, and, finally, piezoelectric elements 40 are obtained. The piezoelectric elements 40 are placed on the flow channel substrate 22 to complete the ink jet recording head of the present embodiment. By preparing the piezoelectric elements 40 using the method described above, an environment friendly, durable ink jet recording head can be achieved.

In the present embodiment, $Bi_2O_3$, $MnO_2$ and $CaZrO_3$ powders are added to a perovskite compound prepared from $Na_2CO_3$, $K_2CO_3$, $Li_2CO_3$, $Nb_2O_5$, and $Ta_2O_5$ powders. That is, $Bi_2O_3$, $MnO_2$ and $CaZrO_3$ powders are added in the course of the preparation of the piezoelectric material. Consequently, the resulting piezoelectric layer 44 can be dense and exhibit superior piezoelectric characteristics. In general, it is not easy to prepare a dense KNN ceramic as grain of KNN materials such as $(K_x,Na_y,Li_{1-x-y})(Nb_z,Ta_{1-z})O_3$ grow greatly during sintering, and accordingly, air on the grain boundaries enters the crystal grains so that the final KNN piezoelectric ceramic show a relatively low density. However, in the present embodiment, is well improved with help of simultaneous addition of Bi2O3 and MnO2 in the course of process. As a result, a dense piezoelectric layer 44 with superior piezoelectric characteristics is obtained.

The flow channel unit 30 includes an ink-delivering hole substrate 31 bonded to the pressure generating chamber bottom plate 24 of the actuator unit 20, a reservoir substrate 33 in which reservoirs 32 are formed as common ink chambers of the pressure generating chambers 21, and a nozzle plate 35 in which nozzle apertures 34 are formed.

The ink-delivering hole substrate 31 is made of, for example, a 150 μm thick zirconia thin plate, and has nozzle communication holes 36 connecting the nozzle apertures 34 and the corresponding pressure generating chambers 21, ink-delivering holes 37 each connecting the corresponding reservoir 32 and pressure generating chamber 21 together with the corresponding supply communication hole 25, and ink-introducing holes 38 communicating with the respective reservoirs 32 to deliver ink from an external ink tank.

The reservoir substrate 33 is made of a corrosion-resistant plate suitable for forming ink flow channels therein, such as a 150 μm stainless steel plate, and has reservoirs 32 that receive ink from an external ink tank (not shown) and deliver the ink to the pressure generating chambers 21, and nozzle communication holes 39 connecting the pressure generating chambers 21 and the nozzle apertures 34.

The nozzle plate 35 is made of, for example, a stainless steel thin plate, and in which nozzle apertures 34 are formed in the same manner at the same pitch as the pressure generating chambers 21. In the present embodiment, since the pressure generating chambers 21 are arranged in two rows, the nozzle apertures 34 are formed in two rows in the nozzle plate 35 of the flow channel unit 30. The nozzle plate 35 is bonded to the surface of the reservoir substrate 33 opposite to the flow channel substrate 22 to seal one side of each of the reservoirs 32.

The flow channel unit 30 is formed by bonding the ink-delivering hole substrate 31, the reservoir substrate 33 and the nozzle plate 35 together with an adhesive, a heat sealing film or the like. Although, in the present embodiment, the reservoir substrate 33 and the nozzle plate 35 are made of stainless steel, they may be formed of, for example, ceramic, and the flow channel unit 30 may be integrally formed in one body, like the actuator unit 20.

The flow channel unit 30 and the actuator unit 20 are bonded together with an adhesive, a heat sealing film or the like.

As shown in FIG. 2, terminal portions 46 electrically connected to the respective piezoelectric elements 40 are each provided at one end in the longitudinal direction of the corresponding piezoelectric element 40, in the region opposing peripheral walls of the pressure generating chambers 21. Terminal portions include the terminal portions 46 provided for the respective piezoelectric elements 40, and another terminal portion (not shown). The terminal portions 46 are electrically connected to the second electrodes 45 of the piezoelectric elements 40, and the other terminal portion is electrically connected to the first electrode 43 led out both sides in the direction in which the piezoelectric elements are arranged in parallel with each other. This terminal portion and the terminal portions 46 are arranged in parallel with each other in the direction of the parallel arrangement of the piezoelectric elements 40. In the present embodiment, the terminal portions 46 are arranged in parallel in two rows between the two rows of the piezoelectric elements 40.

The height of the terminal portion 46 from the surface of the flow channel substrate 22 (or the vibration plate 23) is larger than the height of the piezoelectric element 40 from the surface of the flow channel substrate 22 (or the vibration plate 23). In other words, the level of the upper end of the terminal portion 46 is higher than the level of the upper end of the piezoelectric element 40. This prevents the displacement of the piezoelectric element 40 from being reduced by contact of the wiring substrate 50 with the piezoelectric element 40 that may occur when terminal portion 46 is connected to the wiring layer 51 of the wiring substrate 50. In the present embodiment, the terminal portion 46 has a height of about 20 μm from the surface of the flow channel substrate 22 (vibration plate 23).

The terminal portions 46 may be formed by screen printing using an electrically conductive metal, such as silver (Ag).

The terminal portions electrically connected to the second electrodes 45 and the first electrode 43 of the piezoelectric elements 40 are electrically connected to a wiring layer 51 formed on the wiring substrate 50. A driving signal is transmitted to each piezoelectric element 40 from a driving circuit (not shown) through the wiring substrate 50. The driving circuit may be mounted on the wiring substrate 50 or another.

The wiring substrate 50 may be, for example, a flexible printed circuit (FPC) or tape carrier package (TCP) provided over the piezoelectric elements 40 arranged in two rows. More specifically, the wiring substrate 50 includes a base film 52 of polyimide or the like and a wiring layer 51 having a predetermined pattern on the base film 52. The wiring layer 51 is formed by plating the surface of the base film 52 with a copper foil or the like used as a base, and the entire region of the wiring layer 51 except the ends connected to the terminal portions 46 is covered with an insulating material 53 such as resist.

The wiring substrate 50 has a through hole 54 corresponding to the region between the rows of the piezoelectric elements 40, and the wiring layer 51 is connected to the terminals 46 at portions close to the through hole 54. The through hole 54 of the wiring substrate 50 is formed after continuously forming the wiring layer 51 connected to the piezoelectric elements 40 in one row and the wiring layer 51 connected to the piezoelectric elements 40 in the other row on a surface of the base film 52, in such a manner that the wiring layers 51 are separated by the through hole 54.

The wiring layers 51 of the wiring substrate 50 are electrically and mechanically joined to the terminal portions electrically connected to the piezoelectric elements 40 with an anisotropic conducting layer 55 therebetween.

In the ink jet recording head 10 having the above structure, ink is taken into the reservoir 32 from an ink cartridge through the ink introducing hole 38 to fill the liquid flow channels from the reservoir 32 to the nozzle apertures 34, and then a recording signal is transmitted from a driving circuit (not shown) to the piezoelectric elements 40 through the wiring substrate 50. Thus, a voltage is applied to the piezoelectric elements 40 corresponding to the pressure generating chambers 21 and to make it vibrate so as to deform the vibration plate 23. Consequently, the internal pressures in the pressure generating chambers 21 are increased to eject ink droplets from the nozzle apertures 34.

The durability of the piezoelectric layer 44 formed using the method described above will now be described with reference to the following Experimental Examples.

Sample 1

After being dried at 120° C., commercial powders of $Na_2CO_3$, $K_2CO_3$, $Li_2CO_3$ and $Nb_2O_5$ were used as row materials. These powders were weighed according to the stoichiometric ratio shown in table 1, and pulverized with ethanol or the like in a ball mill. Then the mixture was dried and calcined at 800° C. to yield a complex oxide powder containing K, Na, Li and Nb.

Subsequently, (K, Na, Li)$NbO_3$ powder was granulated with addition of 7 wt % polyvinyl alcohol (PVA) aqueous solution. The granulated powder was pressed into plate at using a die under a pressure of 1500 kg/cm$^2$ and sintered at 1060° C. for 2 hours in oxygen atmosphere.

The sintered ceramic plate were polished to a given thickness. A silver paste was applied onto the polished surfaces by means of screen printing and was then fired at 700° C. for 20 minutes. Thus a pair of electrodes (the first electrode 43 and second electrode 45) was formed on both sides of the piezoelectric layer for poling and measurements.

Poling was done at 130-160° C. in silicon oil under an electric field of 3 to 5 kV/mm for 5 to 15 minutes. Finally a piezoelectric element of Sample 1 was obtained.

Samples 2 and 3

Samples 2 and 3 with composition shown in Table 1 were prepared using the same method as Sample 1. In the case of samples 2 and 3, $Ta_2O_5$ was further added as B-site dopant based on the composition of sample 1 and the sintering was performed at 1120° C. for 2 hours.

Samples 4 to 10

After being dried at 120° C., $Na_2CO_3$, $K_2CO_3$, $Li_2CO_3$, $Nb_2O_5$ and $Ta_2O_5$ powders were weighed out and mixed together and pulverized with ethanol or the like in a ball mill to get a material mixture. The mixture was dried and subsequently calcined at 850° C. to yield a perovskite compound containing K, Na, Li, Nb and Ta.

Subsequently, $Bi_2O_3$ and $MnO_2$ powder were added into the compound and mixed in a ball mill. After the mixed powder was dried, 7 wt % polyvinyl alcohol (PVA) aqueous solution was added into the mixed powder and the powder was granulated. The granulated powder was pressed compacted by die pressing at a pressure of 1500 kg/cm$^2$ in the same method as Sample 1. The resulting compact was sintered at 1160° C. for 2 hours. Piezoelectric layers of Samples 4 to 10 were thus formed.

The surfaces of the resulting piezoelectric layer were polished. A silver paste was applied onto the polished surfaces by means of screen printing and was then fired at 700° C. for 20 minutes. Thus a pair of electrode (the first electrode 43 and second electrode 45) was formed at both sides of the piezoelectric layer to become a piezoelectric element.

Then, a poling was executed. An electric field of 3 to 4 kV/mm was applied to the piezoelectric elements in silicone oil at temperature of from 130° C. to 150° C. for 5 to 15 minutes. After measurements, piezoelectric elements of Samples 4 to 10 were obtained.

Samples 11 to 16

Samples 11 to 16 with the compositions shown in Table 1 were formed in the same method as Samples 4 to 10, except that $CaZrO_3$ was added in addition to the $Bi_2O_3$ and $MnO_2$, and except that the sintering was performed at 1130° C. for 2 hours for Samples 11 and 14, at 1160° C. for 2 hours for Samples 12 and 13, and at 1150° C. for 2 hours for Samples 15 and 16.

Samples 17 and 18

To prepare piezoelectric elements of Samples 17 and 18, at first piezoelectric layers with compositions shown in Table 1 were formed in the same method as Samples 4 to 10, except for addition of $Sb_2O_5$. In formula (2), the mole ratio of $(K_x, Na_y, Li_{1-x-y})(Nb_z, Sb_w, Ta_{1-z-w})O_3$ to $BiMnO_3$ is 1:m.

$$(K_x, Na_y, Li_{1-x-y})(Nb_z, Sb_w, Ta_{1-z-w})O_3 - m[BiMnO_3] \qquad (2)$$

EXPERIMENTAL EXAMPLE 1

Samples 1 to 18 prepared as above were subjected to measurements of the piezoelectric constant $d_{33}$ (displacement property) in the polarization direction, the dielectric loss (tan δ), the dielectric constant $\Sigma_r$ and the density. The results are shown in Table 1. The piezoelectric constant $d_{33}$ was measured by using a piezo $d_{33}$ meter manufactured by UK PIEZOTEST, the dielectric loss tan δ was measured with HP4294A manufactured by Hewlett-Packard, and the density was measured by ARCHIMIDES method at 25° C. The dielectric constant $\Sigma_r$ was measured at 25° C. using HP4294A manufactured by Hewlett-Packard. For Samples 1 to 10, the piezoelectric constant was measured before and after the samples were immersed in water for 3 days, and the reduction of the piezoelectric constant $d_{33}$ was calculated. The results are shown in Table 2.

The results show that Samples 4 to 16, which were examples of the invention prepared by adding bismuth manganate and calcium zirconate to a perovskite compound containing K, Na, Li, Nb and Ta, exhibited a low dielectric loss tan δ and high durability. In addition, they were highly insulative and could be easily subjected to poling. On the other hand, Samples 2 and 3 not containing bismuth manganate and Sample 1 being a perovskite ceramics containing K, Na, Li and Nb exhibited a larger dielectric loss tan δ and lower durability than Samples 4 to 16. The dielectric loss tan δ of each sample was measured for several times after each operation performed in the same manner. Samples 4 to 16 exhibited smaller variations in measured value and higher repeatabilities than Samples 1 to 3.

Samples 4 to 7 and 9 to 16, which are examples of the invention prepared by adding bismuth manganate and further calcium zirconate to a calcined perovskite compound containing K, Na, Li, Nb and Ta, exhibited piezoelectric constants $d_{33}$ over 180 pC/N, which is higher than those of Samples 1 to 3 without bismuth manganate or calcium zirconate. Sample 8 (m=0.01), which contained a relatively large amount of bismuth manganate, exhibited a similar piezoelectric constant $d_{33}$ to Samples 1 to 3.

The results show that Samples 4 to 16, which were examples of the invention prepared by adding bismuth manganate and calcium zirconate to a perovskite compound containing K, Na, Li, Nb and Ta, exhibited low dielectric losses tan δ and high durability.

Samples 4 to 10, which were prepared by adding bismuth manganate to a perovskite compound containing K, Na, Li, Nb and Ta, exhibited high dielectric constants. Samples 11 to 16, which were prepared by further adding calcium zirconate, exhibited remarkably higher dielectric constants, even in comparison with Samples 4 to 10.

The results of Samples 17 and 18 show that the piezoelectric constant $d_{33}$ of embodiments of the invention for the perovskite compound containing Na, K, Li, Nb and Ta and bismuth manganate is considerably reduced by adding antimony.

Figure 4:
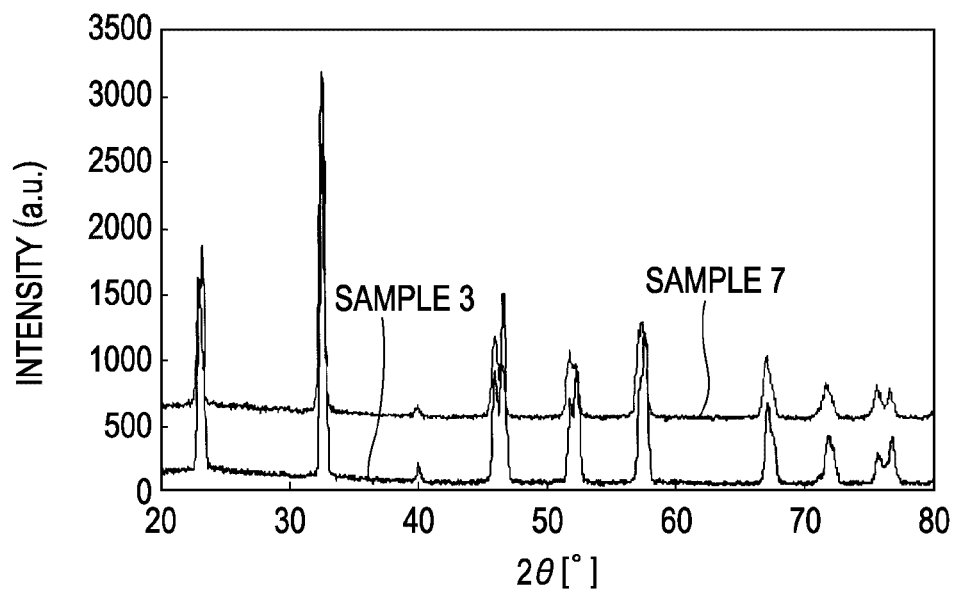
FIG. 4 shows X-ray diffraction patterns of Samples 3 and 7.

The powder X-ray diffraction patterns of Samples 1 to 18 were obtained with D8 Discover manufactured by Bruker AXS using CuKα rays at room temperature. FIG. 4 shows X-ray diffraction patterns of Samples 3 and 7 showing the correlation between the diffraction intensity and diffraction angle 2θ. It can be seen that all Samples 1 to 18 had $ABO_3$ structures, and they did not show peaks derived from other heterogeneous phases.

EXPERIMENTAL EXAMPLE 2

Figure 5:
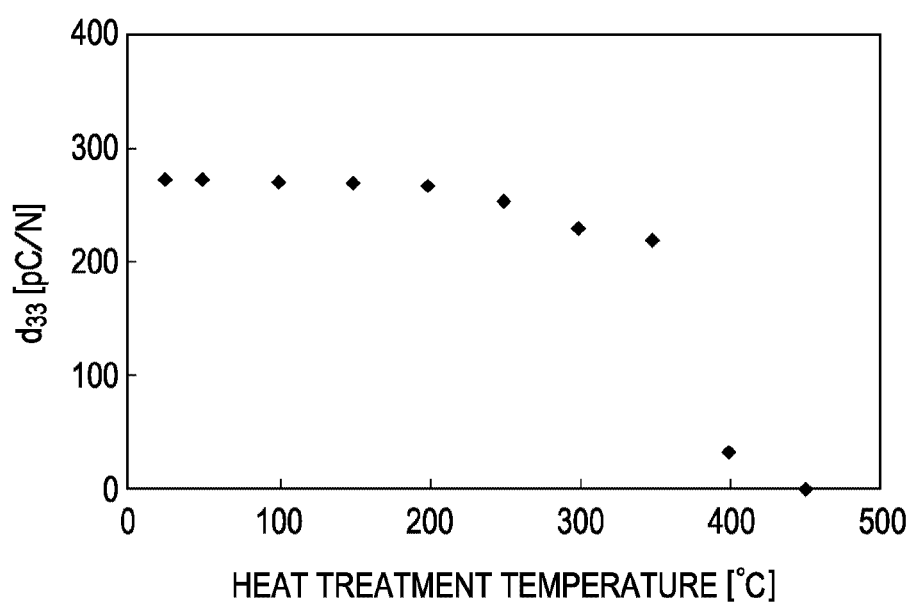
FIG. 5 shows time dependant piezoelectric constant $d_{33}$ of Sample 15.

For Samples 11 to 16, the piezoelectric constants $d_{33}$ were measured after heating at 25° C., 50° C., 100° C., 150° C., 200° C., 250° C., 300° C., 350° C., 400° C. and 450° C. for 5 minutes each. FIG. 5 shows the results of Sample 15. It was shown that the piezoelectric constants $d_{33}$ of Samples 11 to 16 were not almost varied even by heating at 200° C., and thus Samples 11 to 16 have superior thermal stability.

EXPERIMENTAL EXAMPLE 3

Figure 6A:
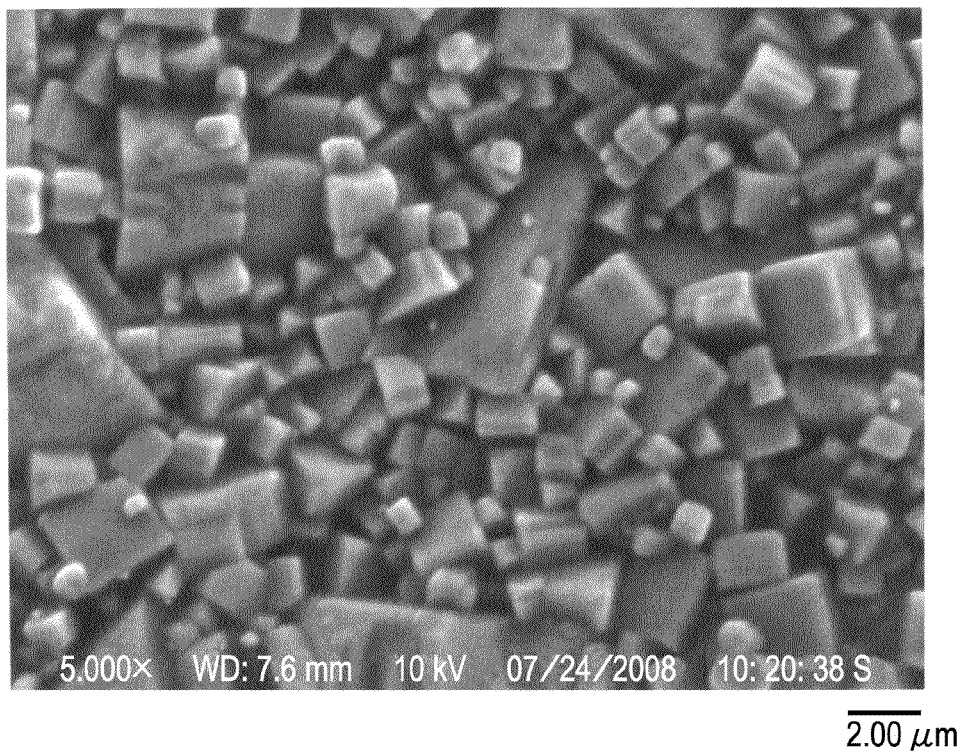
FIGS. 6A and 6B show scanning electron micrographs of Sample 3.
Figure 6B:
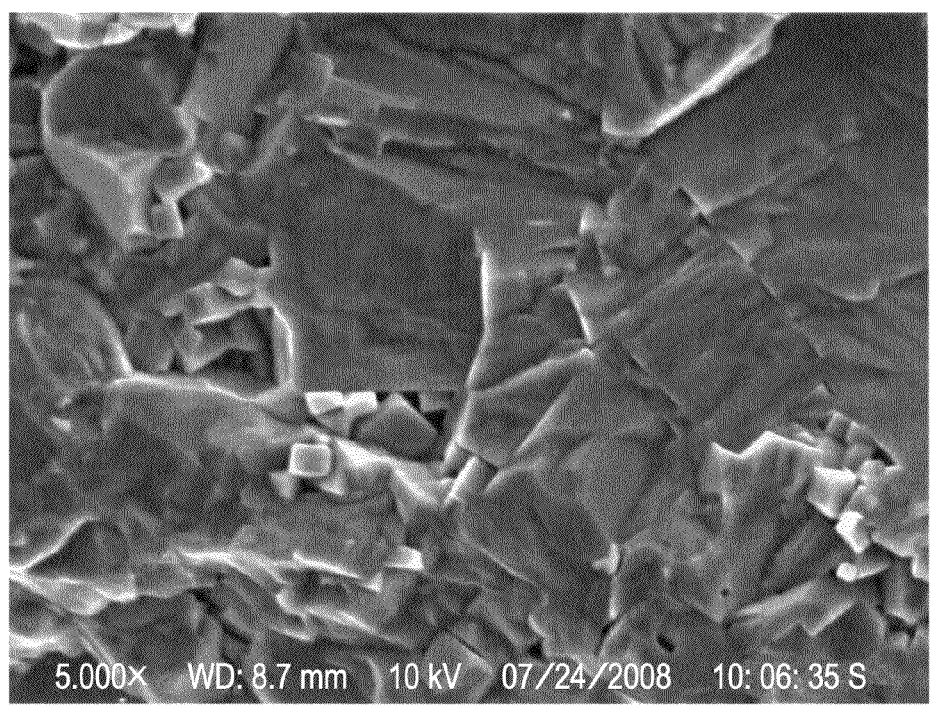
Figure 7A:
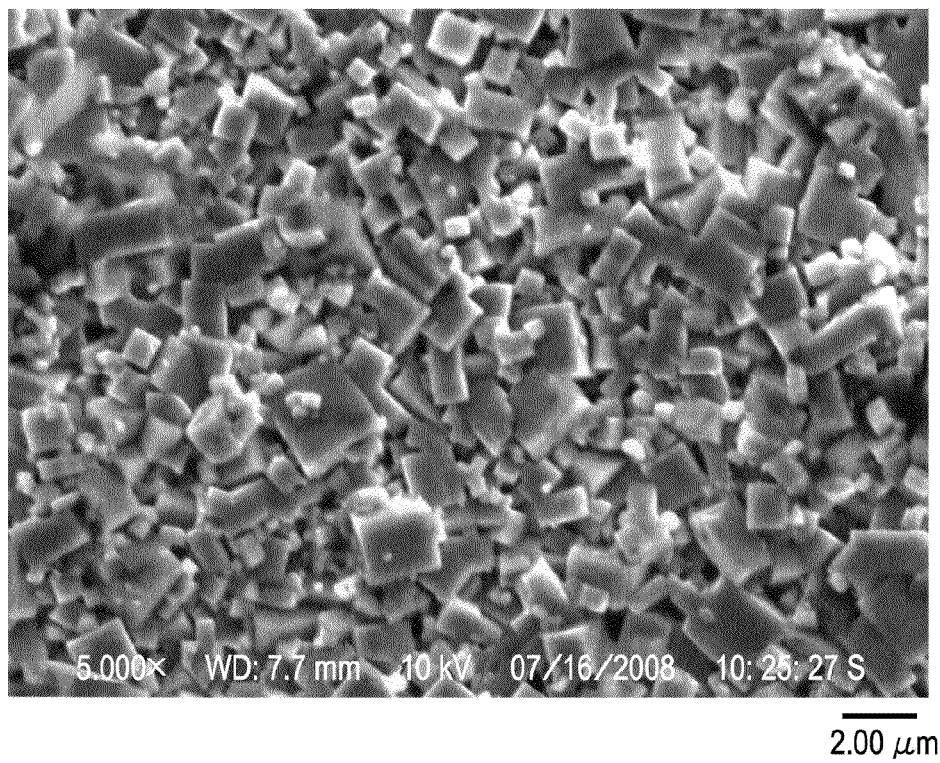
FIGS. 7A and 7B show scanning electron micrographs of Sample 7.
Figure 7B:
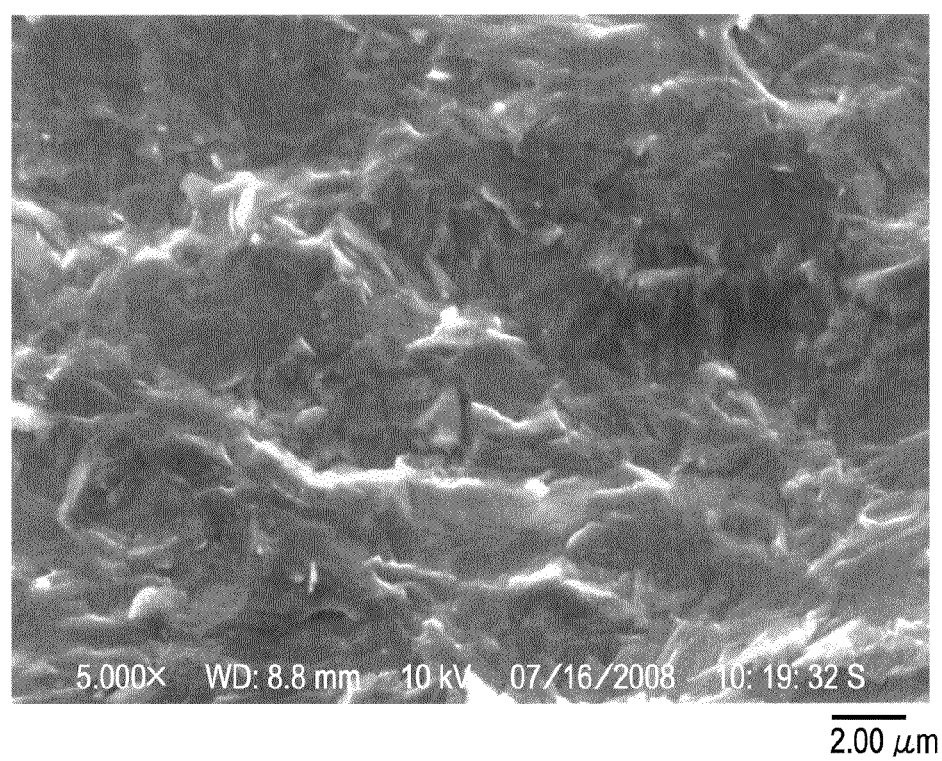
Figure 8:
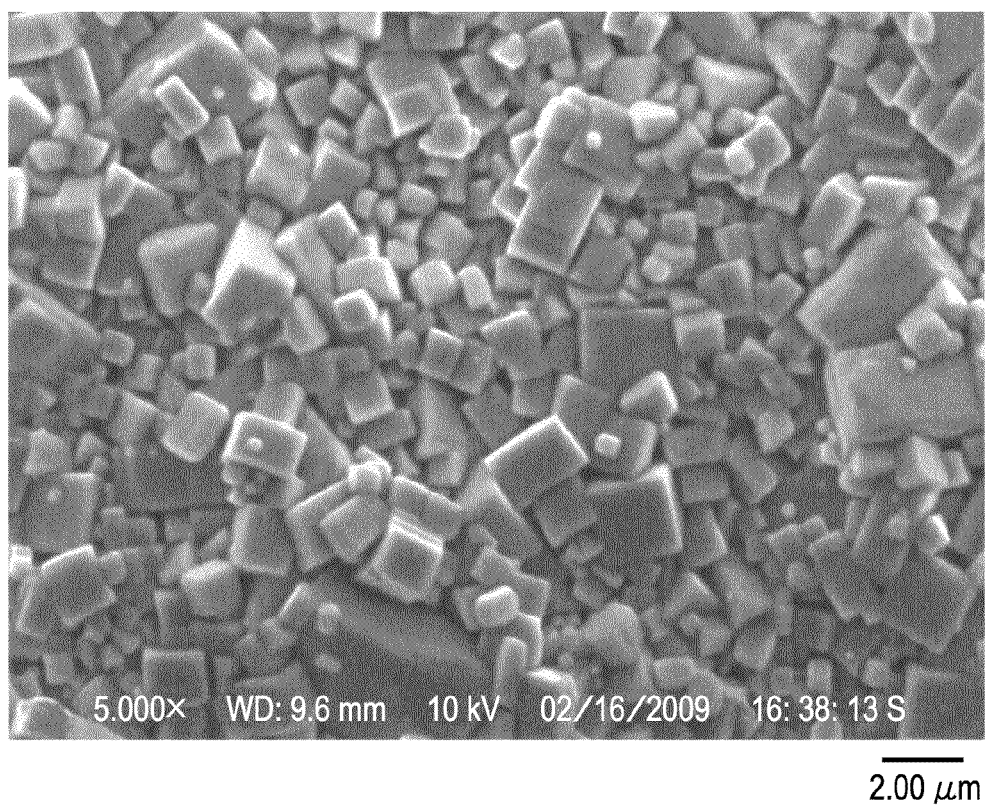
FIG. 8 shows a scanning electron micrograph of Sample 15.

Surfaces and cross sections of Samples 1 to 18 were observed through a scanning electron microscope (SEM) with a magnification of 5000 times. Exemplary results are shown in FIG. 6A (Surface of Sample 3), FIG. 6B (cross sections of Sample 3), FIG. 7A (surface of Sample 7), FIG. 7B (cross sections of Sample 7) and FIG. 8 (Sample 15). As shown in FIGS. 6A to 8, Sample 7 with addition of $BiMnO_3$ had smaller grain size and reduced pores and was denser than Sample 3 without $BiMnO_3$.

Other Embodiments

Although an exemplary embodiment of the invention has been described, the invention is not limited to the disclosed embodiment. For example, although in the first embodiment, a bulk layer is formed as the piezoelectric layer 44 by a solid process, a thin piezoelectric layer having a thickness of about 0.3 to 1.5 μm may be formed by a chemical solution method that is performed by applying a piezoelectric precursor liquid to form a piezoelectric precursor film by a sol/gel method, MOD or the like and heating the precursor film to crystallize it, or a gas phase method, such as sputtering.

Although, in the above embodiment, a ceramic plate is used as the flow channel substrate 22, the flow channel substrate 10 may be made of, for example, monocrystalline silicon, SOI or glass, without particular limitation.

TABLE 1

|  | x | y | z | m | n | Density (g/cm³) | tan δ (%) | Dielectric constant $\in_r$ | $d_{33}$ (pC/N) |
|---|---|---|---|---|---|---|---|---|---|
| Sample 1 | 0.475 | 0.475 | 1 | 0 | 0 | 4.19 | 6.4 | 342 | 157 |
| Sample 2 | 0.475 | 0.475 | 0.85 | 0 | 0 | 4.68 | 4.1 | 843 | 158 |
| Sample 3 | 0.475 | 0.475 | 0.80 | 0 | 0 | 4.80 | 5.4 | 1070 | 170 |
| Sample 4 | 0.475 | 0.475 | 0.85 | 0.0025 | 0 | 4.79 | 1.3 | 812 | 183 |
| Sample 5 | 0.475 | 0.475 | 0.85 | 0.0050 | 0 | 4.81 | 1.8 | 859 | 200 |
| Sample 6 | 0.475 | 0.475 | 0.80 | 0.0025 | 0 | 4.94 | 2.7 | 849 | 222 |
| Sample 7 | 0.475 | 0.475 | 0.80 | 0.0050 | 0 | 4.90 | 1.5 | 820 | 240 |
| Sample 8 | 0.475 | 0.475 | 0.80 | 0.0100 | 0 | 4.67 | 2.1 | 939 | 158 |
| Sample 9 | 0.480 | 0.480 | 0.80 | 0.0025 | 0 | 4.88 | 1.4 | 876 | 214 |
| Sample 10 | 0.470 | 0.470 | 0.80 | 0.0025 | 0 | 4.83 | 1.7 | 912 | 201 |
| Sample 11 | 0.475 | 0.475 | 0.80 | 0.0050 | 0.01 | 4.94 | 1.1 | 1299 | 257 |
| Sample 12 | 0.475 | 0.475 | 0.80 | 0.0050 | 0.02 | 4.94 | 1.3 | 1391 | 254 |
| Sample 13 | 0.475 | 0.475 | 0.80 | 0.0050 | 0.04 | 5.0 | 1.7 | 1579 | 200 |
| Sample 14 | 0.420 | 0.520 | 0.84 | 0.0050 | 0.01 | 4.75 | 1.1 | 1321 | 255 |
| Sample 15 | 0.420 | 0.520 | 0.84 | 0.0050 | 0.02 | 4.78 | 1.5 | 1343 | 274 |
| Sample 16 | 0.420 | 0.520 | 0.84 | 0.0050 | 0.03 | 4.78 | 1.6 | 1387 | 273 |
| Sample 17 | 0.475 | 0.475 | 0.92 | 0.0025 | 0 | 4.57 | 1.3 | 1115 | 46 |
| Sample 18 | 0.475 | 0.475 | 0.92 | 0.0050 | 0 | 4.65 | 1.5 | 1136 | 69 |

TABLE 2

|  | x | y | z | m | n | water resistance |
|---|---|---|---|---|---|---|
| Sample 1 | 0.475 | 0.475 | 1 | 0 | 0 | ⅓ to ¼ reduced |
| Sample 2 | 0.475 | 0.475 | 0.85 | 0 | 0 | ⅓ to ¼ reduced |
| Sample 3 | 0.475 | 0.475 | 0.80 | 0 | 0 | ⅓ to ¼ reduced |
| Sample 4 | 0.475 | 0.475 | 0.85 | 0.0025 | 0 | No change |
| Sample 5 | 0.475 | 0.475 | 0.85 | 0.0050 | 0 | No change |
| Sample 6 | 0.475 | 0.475 | 0.80 | 0.0025 | 0 | No change |
| Sample 7 | 0.475 | 0.475 | 0.80 | 0.0050 | 0 | No change |
| Sample 8 | 0.475 | 0.475 | 0.80 | 0.0100 | 0 | No change |
| Sample 9 | 0.480 | 0.480 | 0.80 | 0.0025 | 0 | No change |
| Sample 10 | 0.470 | 0.470 | 0.80 | 0.0025 | 0 | No change |

Although the piezoelectric element of the above embodiment includes the first electrode, the piezoelectric layer and the second electrode that are formed in that order on a substrate, the structure of the piezoelectric element is not limited to this structure. For example, the invention can be applied to a vertical vibration piezoelectric element including layers of a piezoelectric material and an electrode material alternately formed so as to expand and contract in the axis direction.

Figure 9:
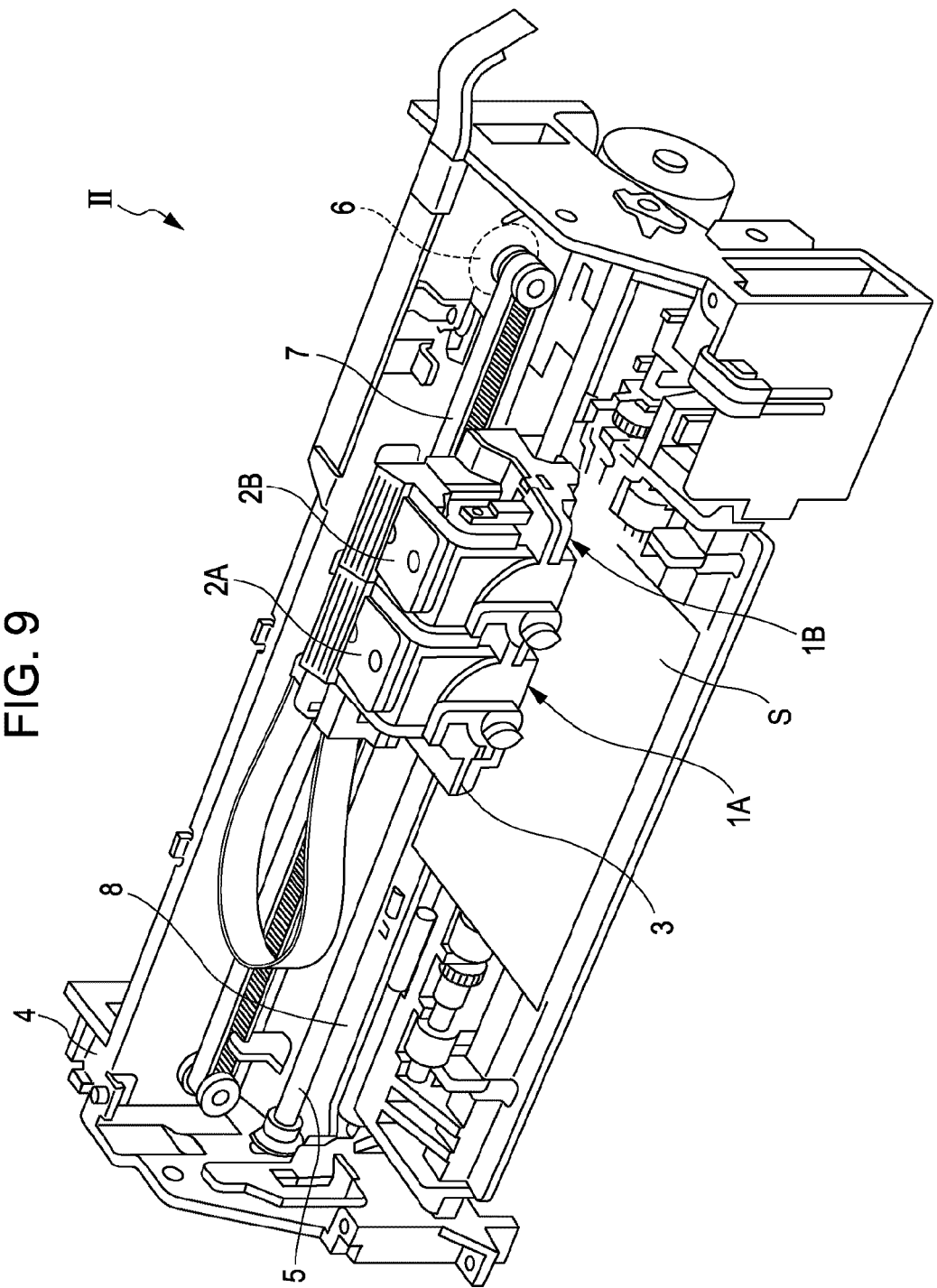
FIG. 9 shows a perspective view of a liquid ejecting apparatus according to another embodiment.

The ink jet recording head according to the embodiments of the invention can be installed in an ink jet recording apparatus to serve as a part of a recording head unit including a flow channel communicating with an ink cartridge or the like. FIG. 9 is a schematic perspective view of an ink jet recording apparatus including the ink jet recording head.

The ink jet recording apparatus II shown in FIG. 9 comprises recording head units 1A and 1B each including the ink jet recording head 10, and cartridges 2A and 2B for supplying ink are removably mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting the driving force from a driving motor 6 to the carriage 3 through a plurality of gears (not shown) and a timing belt 7. In the apparatus body 4, a platen 8 is disposed along the carriage shaft 5 so that a recording sheet S or print medium, such as paper, fed from a paper feed roller or the like (not shown) is transported over the platen 8.

Although the above embodiment has described an ink jet recording head as the liquid ejecting head, the invention is intended for any type of liquid ejecting head, and may be applied to other liquid ejecting heads ejecting liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

The invention can be applied to ultrasonic devices such as ultrasonic oscillators, pressure sensors, ultrasonic motors and other devices. It is not limited to the piezoelectric element used in liquid ejecting heads represented by an ink jet recording head.

What is claimed is:

1. A piezoelectric element comprising:
   a piezoelectric layer made of a perovskite compound containing sodium, potassium, lithium, niobium, tantalum, and bismuth manganate; and
   electrodes for applying a voltage to the piezoelectric layer,
   wherein the piezoelectric layer contains 0.25 to 1 mol % of bismuth manganate relative to the perovskite compound.

2. A liquid ejecting head comprising the piezoelectric element as set forth in claim 1.

3. A liquid ejecting apparatus comprising the liquid ejecting head as set forth in claim 2.

4. A sensor comprising the piezoelectric element as set forth in claim 1.

5. A motor comprising the piezoelectric element as set forth in claim 1.

6. A piezoelectric element comprising:
   a piezoelectric layer comprising:

$$((K_x,Na_y,Li_{1-x-y})(Nb_z,Ta_{1-z})O_3)-(m[BiMnO_3]); \text{ and}$$

electrodes for applying a voltage to the piezoelectric layer,
   wherein 0.420 is less than or equal to x which is less than or equal to 0.480, 0.475 is less than or equal to y which is less than or equal to 0.520, 0.80 is less than or equal to z which is less than or equal to 0.85, 0.0025 is less than or equal to m which is less than or equal to 0.01.

7. A sensor comprising the piezoelectric element as set forth in claim 6.

8. A motor comprising the piezoelectric element as set forth in claim 6.

* * * * *